United States Patent
Ito et al.

(10) Patent No.: US 8,637,385 B2
(45) Date of Patent: Jan. 28, 2014

(54) HIGH VOLTAGE DURABILITY TRANSISTOR AND METHOD FOR FABRICATING SAME

(75) Inventors: Akira Ito, Irvine, CA (US); Henry KuoShun Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 766 days.

(21) Appl. No.: 11/895,473

(22) Filed: Aug. 24, 2007

(65) Prior Publication Data

US 2009/0050971 A1 Feb. 26, 2009

(51) Int. Cl.
*H01L 21/425* (2006.01)
*H01L 21/332* (2006.01)
*H01L 21/4763* (2006.01)
*H01L 21/3205* (2006.01)
*H01L 21/04* (2006.01)
*H01L 29/02* (2006.01)

(52) U.S. Cl.
USPC .......... 438/531; 438/140; 438/532; 438/585; 257/402; 257/487; 257/488; 257/E21.04

(58) Field of Classification Search
USPC ......... 438/531, 532, 585, 510, 514, 542, 551, 438/552, 555
See application file for complete search history.

(56) References Cited

U.S. PATENT DOCUMENTS

| | | | | |
|---|---|---|---|---|
| 5,998,848 A | * | 12/1999 | Brown et al. | 257/407 |
| 6,010,929 A | * | 1/2000 | Chapman | 438/226 |
| 2006/0234439 A1 | * | 10/2006 | Howard et al. | 438/238 |
| 2007/0032002 A1 | * | 2/2007 | Nonaka et al. | 438/192 |

* cited by examiner

*Primary Examiner* — Calvin Choi
(74) *Attorney, Agent, or Firm* — Farjami & Farjami LLP

(57) ABSTRACT

According to one exemplary embodiment, a method for fabricating a high voltage durability transistor comprises forming a gate over a gate oxide layer formed over a substrate, aligning an exposure mask with the gate, and selectively blocking exposure of the gate during gate implant doping, by exposure shields formed in the exposure mask, thereby producing the high voltage durability transistor. In one embodiment, an exemplary high voltage durability transistor comprises a gate formed over a gate oxide layer, the gate oxide layer being situated over a semiconductor substrate, where the gate has a reduced doping implant due to selective implant blocking provided by exposure shields formed in an exposure mask. The selective implant blocking results in an enhanced dielectric barrier so as to produce a high voltage durability transistor. The enhanced dielectric barrier has a depletion region with an increased thickness.

16 Claims, 6 Drawing Sheets

US 8,637,385 B2

HIGH VOLTAGE DURABILITY TRANSISTOR AND METHOD FOR FABRICATING SAME

BACKGROUND OF THE INVENTION

1. Field of the Invention

The present invention is generally in the field of semiconductors. More particularly, the invention is in the field of semiconductor transistors.

2. Background Art

In conventional implementations, a transistor, such as a conventional Field Effect Transistor (FET), may include a heavily doped polysilicon gate structure over a gate oxide, which forms a dielectric barrier between the gate structure and the substrate.

As the transistors utilized in core and input/output (IO) sections of devices have been scaled down to smaller dimensions in advanced process technologies, however, their operating voltages have been reduced as well. Consequently, it has become increasingly difficult to interface these scaled down transistors with the higher voltage operating devices with which they may still need to be compatible. Attempting to utilize conventional circuit design techniques to interface these reduced operating voltage transistors with higher voltage devices can result in problems such as accelerated Time Dependent Dielectric Breakdown (TDDB), for example. As a result, when used with higher voltage devices, the operational lifetimes of those scaled down transistors may fail to meet the desired durability specifications.

One conventional approach to resolving the problems described, requires separate design of circuits utilizing these scaled down transistors in combination with higher voltage devices. Unfortunately this approach tends to be inefficient and time consuming. Another conventional solution requires the addition of processing steps to existing transistor fabrication process flows, an approach that can substantially increase the cost of fabrication while reducing manufacturing throughput.

SUMMARY OF THE INVENTION

A high voltage durability transistor and method for fabricating same, substantially as shown in and/or described in connection with at least one of the figures, as set forth more completely in the claims.

DETAILED DESCRIPTION OF THE INVENTION

The present invention is directed to a high voltage durability transistor and method for fabricating same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

The present invention achieves an innovative transistor having increased high voltage durability. In one embodiment, the invention utilizes exposure shields formed in an exposure mask to selectively block the transistor gate during implant doping. Consequently, the resulting transistor has increased resistance to breakdown of the dielectric barrier formed between the gate and an underlying substrate, making the transistor more durable during high voltage operation. It is noted that although an NFET (N channel FET) is utilized to illustrate the invention, that embodiment is merely exemplary, and the invention can also be applied to other types of transistors, such as a PFET (P channel FET), for example.

Figure 1:
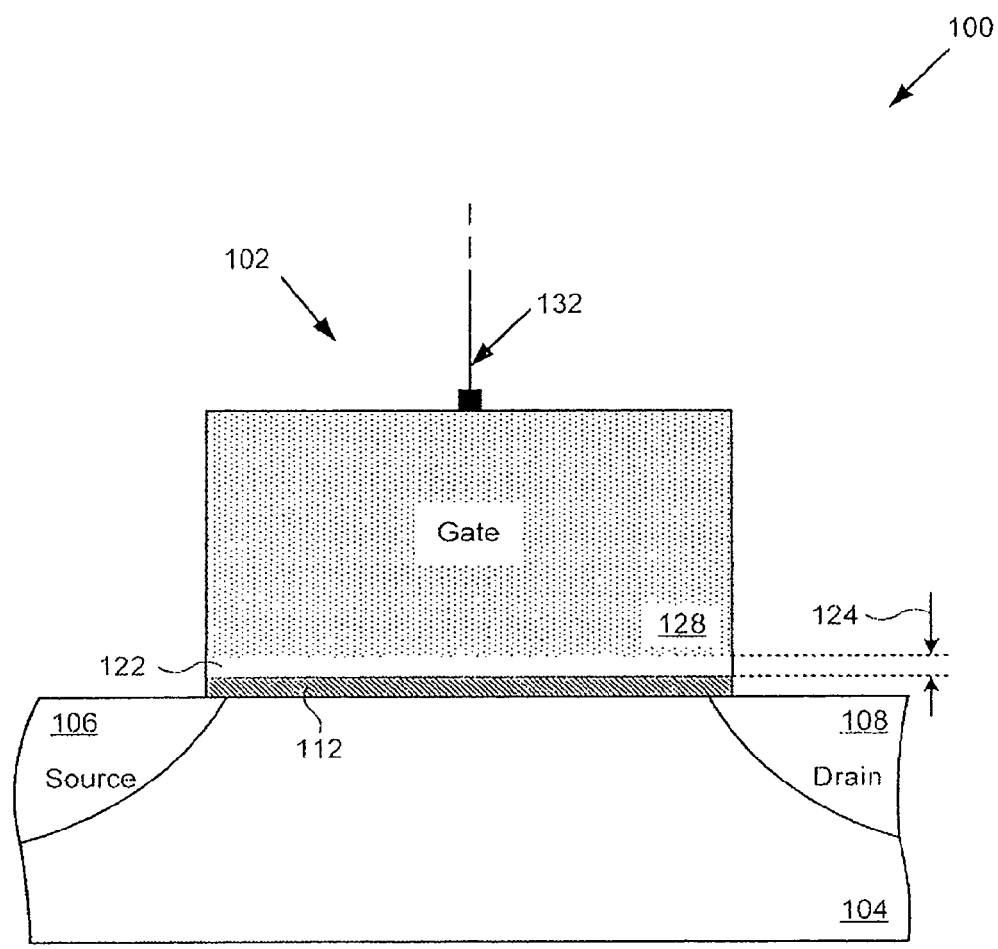
FIG. 1 shows a cross-sectional view of a portion of a conventional exemplary transistor.

FIG. 1 shows a cross-sectional view of a portion of a conventional exemplary transistor. Structure 100 shows a portion of conventional transistor 102 including substrate 104, source region 106, drain region 108, gate oxide layer 112, and gate 128. Also shown in FIG. 1 is depletion region 122 having thickness 124, formed in gate 128. Conventional transistor 102 in FIG. 1 is driven by an operating voltage, conceptually shown as operating voltage 132 applied to gate 128. Conventional transistor 102 can be a FET, such as an NFET, for example.

As shown in FIG. 1, gate oxide layer 112 is situated between gate 128 and substrate 104, providing a dielectric barrier between those sections of conventional transistor 102. Gate oxide layer 112 can comprise silicon oxide, for example, and can be formed over substrate 104 by using a suitable deposition process or thermal oxidation process. Gate 128 is situated over gate oxide layer 112 and can comprise polycrystalline silicon (polysilicon) or other suitable conductive material. Gate 128 can be formed, for example, by depositing a layer of polysilicon over gate oxide layer 112 by using a chemical vapor deposition (CVD) process or other suitable deposition process and appropriately patterning the layer of polysilicon. Also shown in FIG. 1, source region 106 and drain region 108 are situated adjacent to gate 128 and can comprise heavily doped N type regions, for example. Source region 106 and drain 108 can be formed by implanting a large dose of N type dopant, for example, in substrate 104, adjacent to gate 128.

In a conventional transistor, such as conventional transistor 102, application of operating voltage 132 to gate 128 causes charge carriers doped into gate 128 to migrate out of an area adjacent to gate oxide layer 112, resulting in depletion region 122. Thickness 124 of depletion region 122 depends in part on the number of charge carriers implanted into gate 128 during fabrication, in general, varying inversely with the number of charge carriers present. In a conventional transistor, the gate is typically heavily doped in order to reduce gate resistance and enhance performance. As a result, the depletion region typically formed in a conventional transistor may have a small and negligible thickness.

During the operational lifetime of conventional transistor 102, gate oxide layer 112 provides a dielectric barrier between gate 128 and substrate 104. Over time, the dielectric effectiveness of gate oxide layer 112 is reduced due to a phenomenon known as charge trapping, as is known in the art. Charge trapping is a significant factor in determining the Time Dependent Dielectric Breakdown (TDDB) of gate oxide layer 112, which, in turn provides a measure of the operational lifetime of conventional transistor 102. TDDB depends on gate oxide layer thickness, thickness 124 of depletion region 122, as well as the voltage being applied to the transistor gate. In a fabricated transistor, the thickness of gate oxide layer 112 is fixed during the fabrication process. As a result, the operational lifetime of conventional transistor 102 may be heavily influenced by voltage applied to gate 128.

As discussed previously, conventional transistors utilized in core and input/output (IO) sections, for example, have been scaled down to smaller dimensions in advanced process technologies. The advantageous reductions in scale achieved through these improvements have been accompanied by reductions in the operating voltages of these scaled down devices, however. As a result, conventional transistors, such as conventional transistor 102 may be more vulnerable to TDDB effects as a result of being interfaced with higher voltage devices. Consequently, when used with a higher voltage device, conventional transistor 102 may fail to meet the desired durability specifications due to breakdown of the dielectric properties of gate oxide layer 112.

Figure 2:
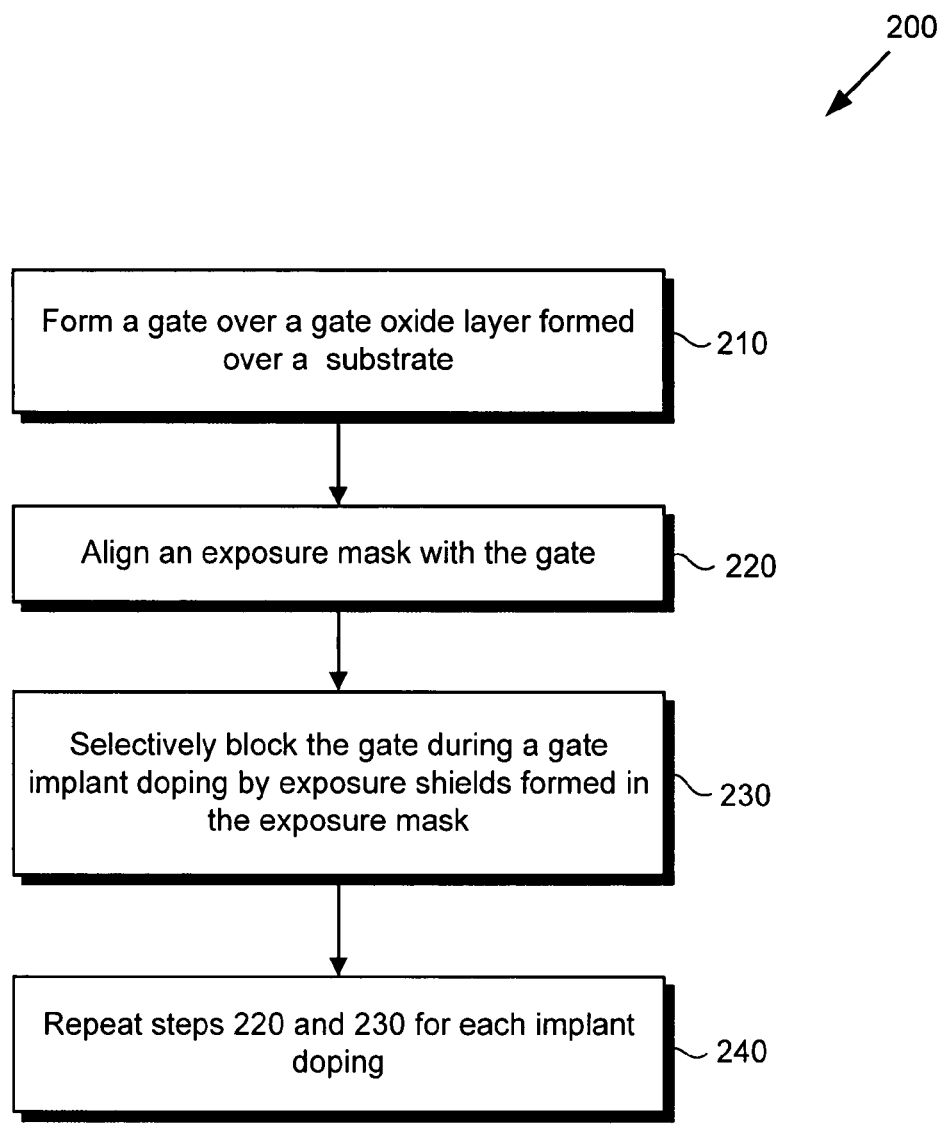
FIG. 2 shows a flowchart of an exemplary method to implement an embodiment of the present invention.

FIG. 2 shows a flowchart of an exemplary method to implement an embodiment of the present invention. Certain details and features have been left out of flowchart 200 that are apparent to a person of ordinary skill in the art. For example, a step may comprise one or more substeps or may involve specialized equipment or materials, as known in the art. While steps 210 through 240 indicated in flowchart 200 are sufficient to describe one embodiment of the present invention, other embodiments of the invention may utilize steps different from those shown in flowchart 200.

Figure 3A:
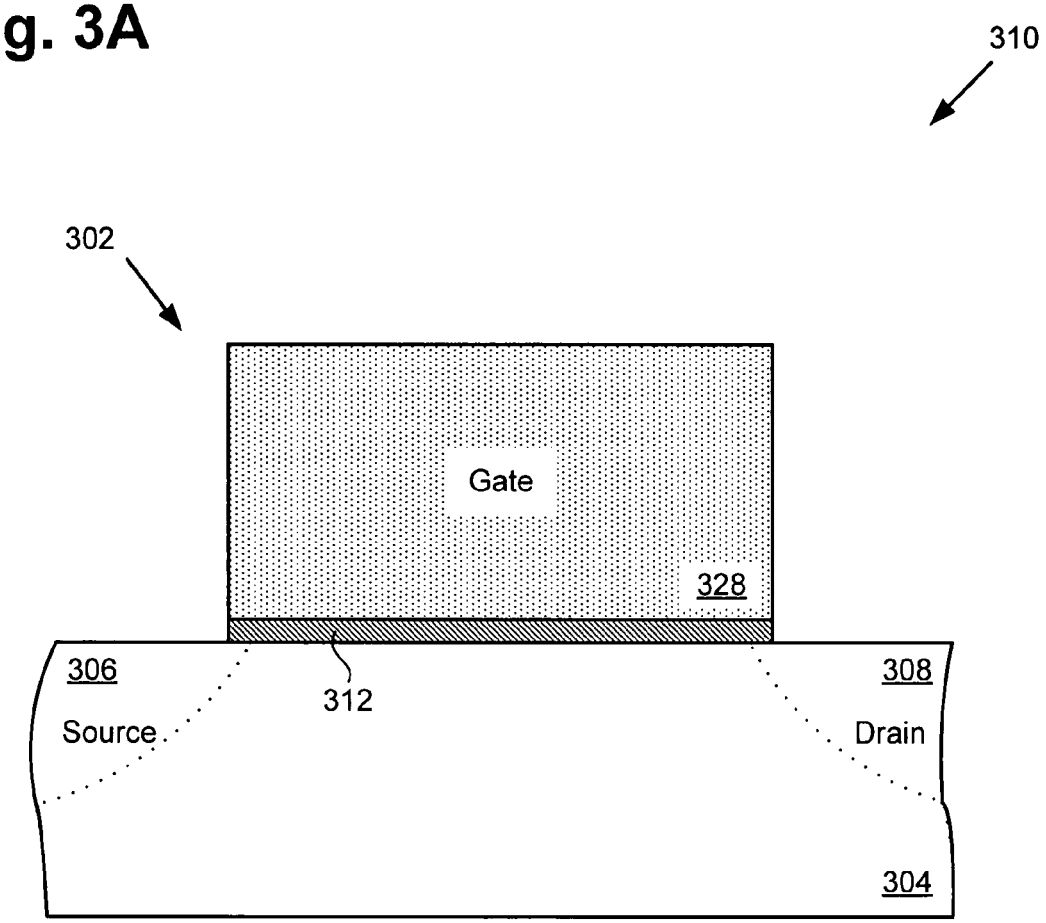
FIG. 3A shows a cross-sectional view of an exemplary structure corresponding to an initial step in the flowchart of FIG. 2.
Figure 3B:
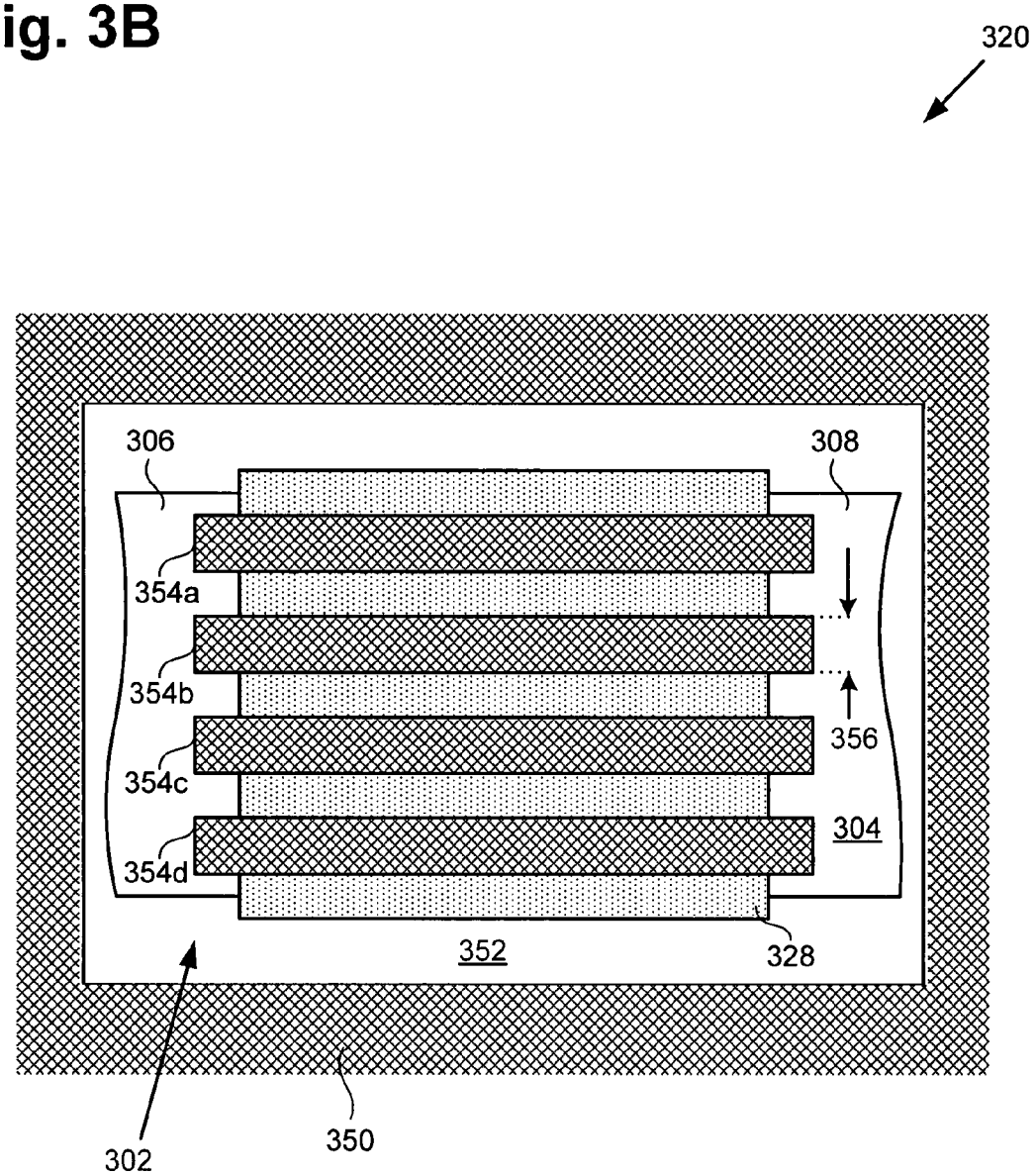
FIG. 3B shows a top view of an exemplary structure corresponding to an intermediate step in the flow chart of FIG. 2.
Figure 4:
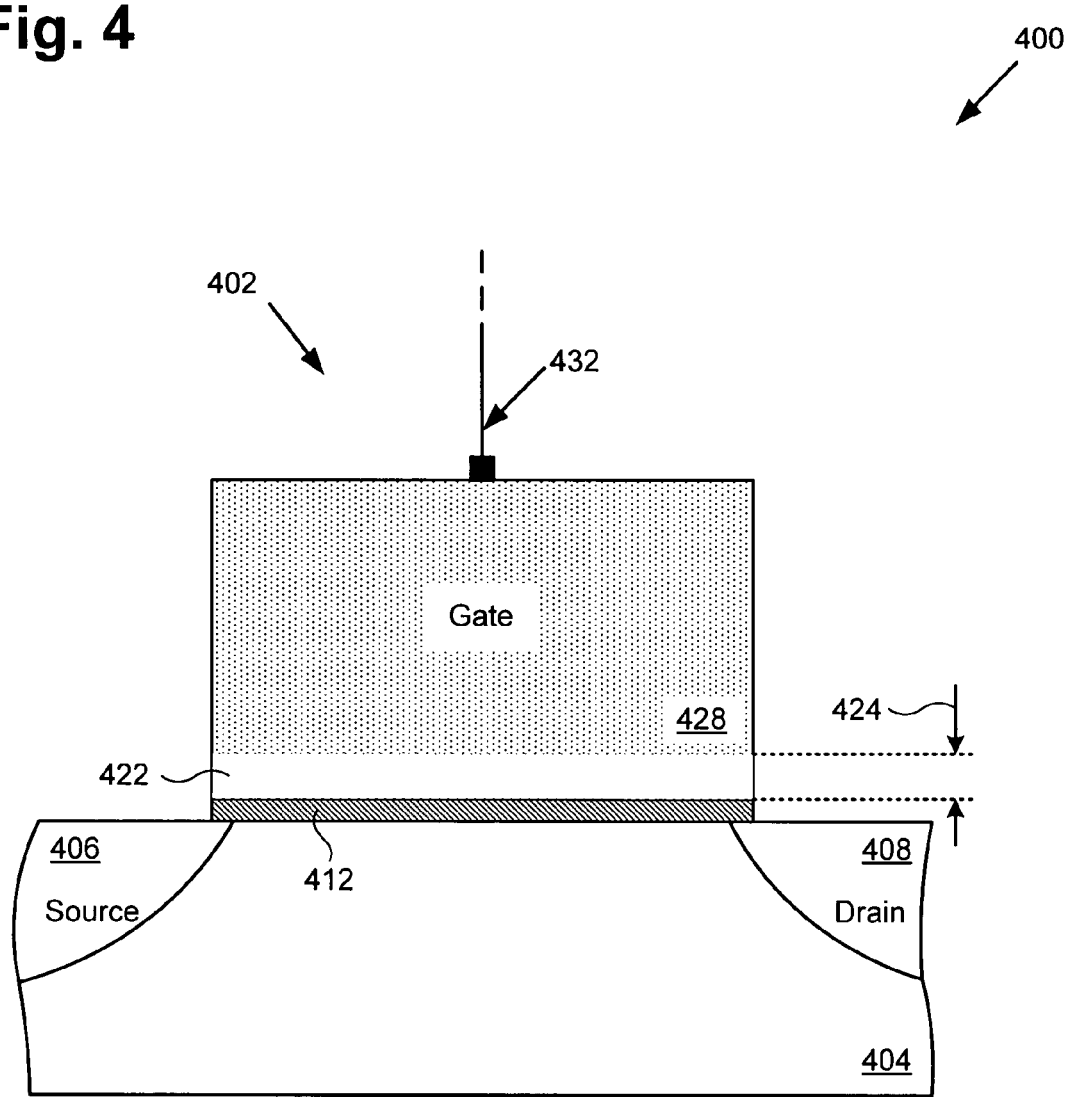
FIG. 4 shows a cross-sectional view of a portion of an exemplary high voltage durability transistor, according to one embodiment of the present invention.

Referring now to FIG. 3A, structure 310 of FIG. 3A shows a cross-sectional portion of a transistor prior to gate implant doping according to an embodiment of the present invention. Structure 310 shows a portion of transistor 302, including substrate 304, source formation region 306, drain formation region 308, gate oxide layer 312, and gate 328, according to one embodiment of the invention shown in flowchart 200 of FIG. 2. In particular, structure 310 shows a cross section of a portion of transistor 302 after processing step 210 of flowchart 200. Referring to FIG. 3B, structure 320 is a top view of the result of performing step 220 of flowchart 200 of FIG. 2 on structure 310. Structure 400 in FIG. 4 shows a cross section of a portion of an exemplary transistor following fabrication according to the method of flowchart 200.

Continuing with step 210 in FIG. 2 and structure 310 in FIG. 3A, step 210 of flowchart 200 comprises forming gate 328 over gate oxide layer 312, formed over substrate 304. Gate oxide layer 312 can be formed, for example, by depositing a layer of gate oxide, such as silicon oxide or nitridized silicon oxide, over substrate 304 by using a CVD process or thermal oxidation process. Gate 328 can be formed, for example, by using a CVD process to deposit a layer of polysilicon over gate oxide layer 312 and appropriately patterning the polysilicon layer.

As shown in FIG. 3A, source formation region 306 and drain formation region 308 are located in substrate 304, which can be a lightly doped P type substrate, for example. Source formation region 306 and drain formation 308 correspond respectively to source and drain regions that will be present in transistor 302 when fabrication is complete. Consequently, dashed lines are used in FIG. 3A to provide a frame of reference while also indicating that those regions may not be clearly defined during step 210 of flowchart 200. A source formed in source formation region 306 and a drain formed in drain formation region 308 can comprise heavily doped N type regions, for example. A source and a drain can be formed by implanting a large dose of N type dopant, for example, in respective source and drain formation regions 306 and 308.

At step 220 in FIG. 2 and structure 320 in FIG. 3B, exposure mask 350 is aligned with gate 328, which is shown in top view and corresponds to gate 328 in FIG. 3A, which was shown in cross-sectional view. Structure 320 in FIG. 3B also shows a top view of transistor 302 comprising source formation region 306 and drain formation region 308, situated in substrate 304, and gate 328. Exposure mask 350 is aligned so as to permit implant doping of gate 328. Exposure mask 350 includes open region 352 for implant doping of gate 328. Exposure shields 354a, 354b, 354c, and 354d, each having width 356, are formed in exposure mask 350, and provide selective blocking of gate 328 during implant doping in subsequent step 230 of flowchart 200. Exposure mask 350, as well as exposure shields 354a, 354b, 354c, and 354d, may comprise any material suitable for use as a block during doping implant, as known in the art, and may comprise, for example, a conventional photoresist.

Proceeding with step 230 of flowchart 200, but continuing with reference to FIG. 3B, step 230 of flowchart 200 comprises selectively blocking gate 328 during gate implant doping, by exposure shields 354a, 354b, 354c, and 354d, formed in exposure mask 350. Implant doping may be performed using arsenic or phosphorus as doping agents, for example. According to the present embodiment, four such exposure shields, uniformly separated and each having width 356, are formed in exposure mask 350, but this is exemplary only, and other embodiments may have more numerous or less numerous exposure shields formed in an exposure mask.

The presence of exposure shields 354a, 354b, 354c, and 354d, provides selective blocking of implant doping of the corresponding portions of gate 328. The extent of doping implant blocking provided using the present method may be selected by adjustment of the number, width, and separation of the exposure shields. The number, width, and separation of exposure shields, such as exposure shields 354a, 354b, 354c, and 354d, may be selected so that diffusion of the implanted dopant into the regions blocked by the exposure shields, results in substantially uniform doping of gate 328, albeit at a substantially reduced doping level than achievable without the exposure shields. For example, the present method may reduce doping concentration by approximately half, so that a minimum doping level of approximately $1 \times 10^{18}$ atoms per cubic centimeter achievable through conventional fabrication techniques may be reduced to approximately $5 \times 10^{17}$ atoms per cubic centimeter, in an N type doping process.

Referring to step 240 of FIG. 2, step 240 of flowchart 200 comprises repetition of steps 220 and 230 for subsequent implant doping. In the present embodiment, selective blocking by exposure shields 354a, 354b, 354c, and 354d, occurs at each implant step. In one embodiment, selective blocking may occur only during a first implant doping process for example, and an additional N+ implant step may be omitted. It is reiterated that although the present embodiment refers consistently to an exemplary NFET process, the invention may be utilized in fabricating other types of devices, such as PFET devices, for example.

FIG. 4 shows a cross-sectional view of a portion of an exemplary high voltage durability transistor, according to one embodiment of the present invention. Structure 400 shows a portion of high voltage durability transistor 402 including substrate 404, source region 406, drain region 408, gate oxide layer 412, and gate 428. Also shown in FIG. 4 is depletion region 422 having thickness 424, formed in gate 428. High voltage durability transistor 402, in FIG. 4, is driven by an operating voltage, conceptually shown as operating voltage 432 applied to gate 428. High voltage durability transistor 402 can be a FET, such as an NFET, for example, with its aforementioned enumerated elements corresponding respectively to those shown for conventional transistor 102, in FIG. 1.

As is true for conventional transistor 102 in FIG. 1, in high voltage durability transistor 402 in FIG. 4 gate oxide layer 412 is situated between gate 428 and substrate 404, providing a dielectric barrier between those sections of high voltage durability transistor 402. Also shown in FIG. 4, source region 406 and drain region 408 are situated adjacent to gate 428 and can comprise heavily doped N type regions, for example. Source region 406 and drain 408 can be formed by implanting a large dose of N type dopant, for example, in substrate 404, adjacent to gate 428.

Doping of gate 428 in high voltage durability transistor 402 is performed according to the present invention's method, of which an exemplary series of steps was provided in flowchart 200. As a result, and as described previously, gate 428 has a lower level of doping than is to be found in gate 128 of conventional transistor 102, for example. Because of the lower doping present in gate 428, application of operating voltage 432 to gate 428 results in depletion region 422 having thickness 424 substantially greater than thickness 124 of depletion region 122, in FIG. 1.

It is noted that due to being depleted of charge carriers, depletion region 422 is effectively an additional dielectric layer, produced in response to application of operating voltage 432, so as to cooperate with gate oxide layer 412 in providing an enhanced dielectric barrier between gate 428 and substrate 404. Thus, due to the reduced dopant concentration in gate 428, achieved through implant dopant blocking by exposure shields formed in an exposure mask, according to the present invention, thickness 424 of depletion region 422 is substantially larger under an applied voltage than is the case for conventional transistors. Consequently, comparatively thick depletion region 422 cooperates with gate oxide layer 412 to make high voltage durability transistor 402 less susceptible to failure in the presence of a higher operating voltage and more resistant to TDDB. In other words, unlike conventional transistor 102, high voltage durability transistor 402 is capable of operating at a higher voltage, for example from approximately 5 volts to approximately 7 volts, and is able to sustain that higher operating voltage over a longer operational lifetime. Moreover, the described durability advantages may be achieved without adding additional masks or process steps to existing foundry process flows, as can be seen from the exemplary method steps presented in flowchart 200.

Figure 5:
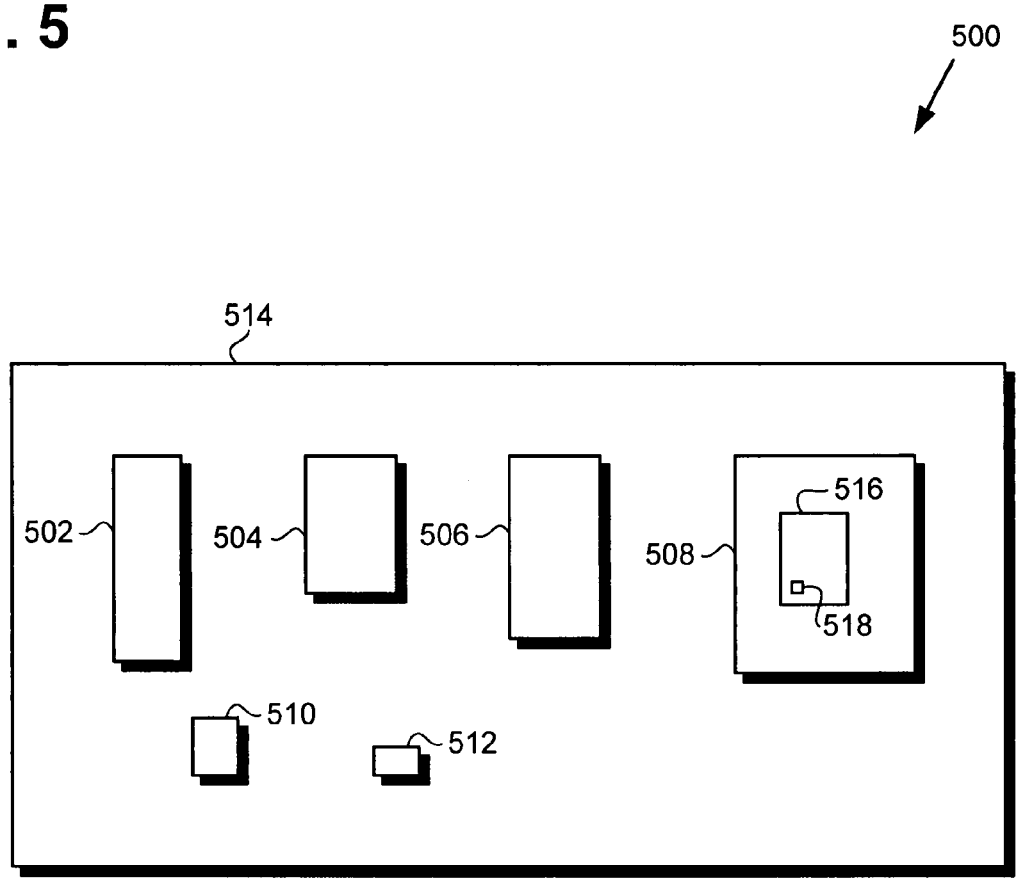
FIG. 5 shows a diagram of an exemplary electronic system including an exemplary chip or die utilizing one or more high voltage durability transistors, in accordance with one embodiment of the present invention.

FIG. 5 shows a diagram of an exemplary electronic system including an exemplary chip or die utilizing one or more high voltage durability transistors, in accordance with one embodiment of the present invention. Electronic system 500 includes exemplary modules 502, 504, and 506, IC chip or semiconductor die 508, discrete components 510 and 512, residing in and interconnected through printed circuit board (PCB) 514. In one embodiment, electronic system 500 may include more than one PCB. IC chip 508 includes circuit 516, which utilizes one or more of the invention's high voltage durability transistors designated by numeral 518.

As shown in FIG. 5, modules 502, 504, and 506 are mounted on PCB 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. PCB 514 can include a number of interconnect traces (not shown in FIG. 5) for interconnecting modules 502, 504, and 506, discrete components 510 and 512, and IC chip 508.

Also shown in FIG. 5, IC chip 508 is mounted on PCB 514 and can be, for example, any chip utilizing an embodiment of the invention's high voltage durability transistor. In one embodiment, IC chip 508 may not be mounted on PCB 514, and may be interconnected with other modules on different PCBs. As stated above, circuit 516 is situated in IC chip 508 and includes one or more embodiments of the invention's high voltage durability transistor(s) 518. Further shown in FIG. 5, discrete components 510 and 512 are mounted on PCB 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor. Discrete components 510 and 512 may themselves utilize one embodiment of the invention's high voltage durability transistor.

Electronic system 500 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

As disclosed in the foregoing, the present invention overcomes the drawbacks and deficiencies in the art by providing a high voltage durability transistor and method for fabricating same. By utilizing exposure shields formed in an exposure mask to reduce the dopant concentration implanted in a transistor gate, the present invention's method results in production of a depletion region with increased thickness which provides the transistor with increased resistance to dielectric breakdown under high operating voltages. By selectively blocking exposure of a transistor gate during existing implant doping steps, the present method integrates its novel techniques into existing fabrication process flows, so as to advantageously provide its improvements without reduction to manufacturing throughput, or increase in manufacturing cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a high voltage durability transistor and method for fabricating same have been described.

The invention claimed is:

1. A method of fabricating a high voltage durability transistor, said method comprising:
    forming a gate over a gate oxide layer formed over a substrate;
    aligning an exposure mask with said gate;
    selectively blocking exposure of portions of said gate to gate implant doping during said gate implant doping by exposure shields formed in said exposure mask;
    wherein said gate is substantially uniformly doped; and
    wherein said high voltage durability transistor is configured to have a substantially uniform thickness depletion region in said gate in response to application of an operational voltage to said gate.

2. The method of claim 1, wherein said substantially uniform thickness depletion region provides an enhanced dielectric barrier between said gate and said substrate.

3. The method of claim 1, wherein said high voltage durability transistor comprises a FET.

4. The method of claim 1, wherein said high voltage durability transistor comprises an NFET.

5. The method of claim 4, wherein said gate implant doping comprises implanting a dopant selected from the group consisting of arsenic and phosphorus.

6. The method of claim 1, wherein said selectively blocking exposure of said gate results in a gate dopant concentration less than approximately $1\times10^{18}$ atoms per cubic centimeter.

7. The method of claim 1, wherein said high voltage durability transistor sustains an operating voltage in a range from approximately 5 volts to approximately 7 volts.

8. A method of fabricating a high voltage durability transistor, said method comprising:
    forming a gate over a gate oxide layer formed over a substrate;
    aligning an exposure mask with said gate;
    selectively exposing said gate to implant doping by blocking exposure of portions of said gate to said implant doping using a plurality of striped exposure shields over said gate formed in said exposure mask;
    wherein said high voltage durability transistor is configured to have a substantially uniform thickness depletion region in said gate in response to application of an operational voltage to said gate.

9. The method of claim 8, wherein said substantially uniform thickness depletion region provides an enhanced dielectric barrier between said gate and said substrate.

10. The method of claim 8, wherein said high voltage durability transistor comprises a FET.

11. The method of claim 8, wherein said high voltage durability transistor sustains an operating voltage in a range from approximately 5 volts to approximately 7 volts.

12. A method of fabricating a high voltage durability transistor, said method comprising:
    forming a gate over a gate oxide layer formed over a substrate;
    aligning an exposure mask with said gate;
    selectively blocking exposure of portions of said gate to gate implant doping during said gate implant doping, causing said high voltage durability transistor to have a substantially uniform thickness depletion region in said gate in response to application of an operational voltage to said gate.

13. The method of claim 12, wherein said high voltage durability transistor comprises a FET.

14. The method of claim 12, wherein said high voltage durability transistor comprises an NFET.

15. The method of claim 12, wherein said gate implant doping comprises implanting a dopant selected from the group consisting of arsenic and phosphorus.

16. The method of claim 12, wherein said selectively blocking exposure of said gate results in a gate dopant concentration less than approximately $1\times10^{18}$ atoms per cubic centimeter.

* * * * *